United States Patent
Yoshimura et al.

(10) Patent No.: US 6,294,794 B1
(45) Date of Patent: *Sep. 25, 2001

(54) NON-LINEAR OPTICAL DEVICE USING QUANTUM DOTS

(75) Inventors: Tetsuzo Yoshimura; Toshiro Futatsugi, both of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/018,858

(22) Filed: Feb. 4, 1998

(30) Foreign Application Priority Data

Aug. 14, 1997  (JP) .................................................. 9-219507

(51) Int. Cl.⁷ ........................ H01L 29/06; H01L 31/0328; H01L 31/0336; H01L 31/072; H01L 31/109
(52) U.S. Cl. ............................... 257/14; 257/185; 438/74
(58) Field of Search .................................. 257/14, 17, 21, 257/185; 438/31, 74

(56) References Cited

U.S. PATENT DOCUMENTS

| | | | |
|---|---|---|---|
| 5,079,594 | * | 1/1992 | Mitsuyu et al. ................... 257/21 |
| 5,187,715 | * | 2/1993 | Weisbuch et al. .................. 257/21 |
| 5,440,148 | * | 8/1995 | Nomoto ............................ 257/21 |
| 5,559,343 | * | 9/1996 | Kiehl .............................. 257/14 |

FOREIGN PATENT DOCUMENTS 04-354170 * 12/1992 (JP) .

OTHER PUBLICATIONS

PTO 2000–2218—Translation of JP–04354170, May 31, 1991.*

Deppe et al., "Quantum Well and Quantum Dot Light Emitters Confined in Oxide–Semiconductor Microcavities", Optics & Photonics, pp. 30–3, Jan. 1998.*

Tetsuzo Yoshimura, Fujitsu Sci. Tech. J., 27, 1, pp. 115–131, Apr. 1991.

Yoshiaki Nakata et al, Journal of Crystal Growth 175/176, pp. 713–719, 1997.

* cited by examiner

Primary Examiner—Olik Chaudhuri
Assistant Examiner—Howard Weiss
(74) Attorney, Agent, or Firm—Armstrong, Westerman, Hattori, McLeland & Naughton, LLP

(57) ABSTRACT

A non-linear optical device includes a plurality of quantum dots in an active layer such that the quantum dots have a composition or doping modified asymmetric in a direction perpendicular to the active layer.

14 Claims, 18 Drawing Sheets

NON-LINEAR OPTICAL DEVICE USING QUANTUM DOTS

BACKGROUND OF THE INVENTION

1. Field of the Invention

The present invention generally relates to non-linear optical devices and, more particularly, to a non-linear optical device that uses quantum dots.

2. Description of the Related Art

A non-linear optical device is an optical device that changes an optical state such as a refractive index or polarization plane thereof, in response to an electric field or optical radiation applied thereto. Thus, intensive and extensive investigations are being made on non-linear optical devices in relation to optical integrated circuits and optical information processing devices including photonic interconnection substrates, photonic multichip modules, photonic backplanes, and the like. Particularly, the non-linear optical devices are studied intensively in relation to an optical switch of an optical waveguide, an optical spatial modulator, an optical filter, and the like. In the case of an optical switch, for example, the optical path of an optical beam passing through a non-linear optical medium is modified by inducing a change of refractive index in the medium by applying thereto a control optical beam or control electric field.

Conventionally, non-linear optical devices generally have used an inorganic crystal that lacks point symmetry, such as a $LiNbO_3$ crystal, for the non-linear optical medium. On the other hand, there is a proposal to use an organic polymer material having a substantially one-dimensionally aligned chain-like molecular structure for the material that shows a large non-linear optical effect. See for example T. Yoshimura, Fujitsu Sci. Tech. J., 27, 1, pp. 115–131, 1991. It should be noted that such a polymer that has a substantially one-dimensionally aligned molecular structure forms a quantum wire in which carriers are confined two-dimensionally. As a result of such a two-dimensional carrier confinement pertinent to a quantum wire, the polymer material shows a very large non-linear optical effect.

It should be noted that a non-linear optical effect is a result of mixing of different quantum states. Thus, the observed non-linear optical effect changes depending upon a difference as well as a degree of overlapping of the wavefunctions of different quantum states or quantum levels. For example, the susceptivity $\beta$ of a second-order non-linear optical effect is given by $$\beta = f \cdot (P_e - P_g)$$

where the terms $f$, $P_e$ and $P_g$ are given as $$f \propto <E|r|G>^2$$

$$P_e = <E|r|E> \text{ and } P_g = <G|r|G>,$$

in which the term f is an oscillator intensity while the terms $P_g$ and $P_e$ represent a dipole moment. In the foregoing representation, G stands for a wavefunction of a ground state and E stands for a wavefunction of an excited state. Further, r stands for a positional vector.

FIG. 1 shows the examples of calculated terms $f$, $P_e - P_g$ and $\beta$ for three different sets of electron clouds corresponding to the wavefunctions E and G.

Referring to FIG. 1, it will be understood that the term $P_e - P_g$ becomes zero when the wavefunctions E and G are identically located, as represented in the example at the left of FIG. 1. In such a case, therefore, no second-order non-linear optical effect is observed. When the difference between the wavefunctions E and G is excessive and there is no overlapping of the wavefunctions at all as in the example at the right of FIG. 1, the term f becomes substantially zero and the second-order non-linear optical effect $\beta$ is not observed. When the overlapping of the wavefunctions E and G is optimum as in the case at the center of FIG. 1, on the other hand, the foregoing term $\beta$ indicative of the second-order non-linear optical effect becomes a maximum.

As explained already, it is possible to maximize the second-order non-linear optical effect by using an organic material that includes a one-dimensionally extending quantum wire. Thus, it is predicted that the second-order non-linear optical effect would be enhanced further when quantum dots that confine carriers three-dimensionally is used for the non-linear optical medium of the non-linear optical device. Such quantum dots can be formed easily in an organic material in the form of discrete molecules.

However, such organic quantum dots generally fail to provide a desired sharp spectrum expected for a quantum dot due to the increased electron-photon interaction in an organic material. Thus, the enhancement of the second-order non-linear optical effect, which is based on the resonant excitation of electrons from the ground state G to the excited state E, is not achieved as desired when an organic quantum dot is used. Further, such an organic quantum medium tends to suffer from a problem in that the desired alignment of the molecules is difficult.

In a strained heteroepitaxial system as in a case of an InAs/GaAs epitaxial structure, on the other hand, it is also known that the quantum dots can be formed easily in the form of mutually isolated islands, by using a so-called S-K (Stranski-Krastanov) mode growth that appears in the initial period of a heteroepitaxial process. For example, there is a report that an island of InGaAs is formed on a GaAs substrate with a diameter of 30–40 nm, by depositing an InGaAs layer containing about 50% of. In on a GaAs substrate by an MBE process with a thickness of several molecular layers (Leonard, D., et al., Appl. Phys. Lett., 63, pp.3203–3205, 1993). Further, a similar formation of islands of InGaAs on a GaAs substrate is reported, in which the InGaAs islands are formed on the substrate by an ALE (atomic layer epitaxy) process with a diameter of 15–20 nm and a mutual separation of about 100 nm (Mukai, K., et al., Jpn. J. Appl. Phys., 33, pp.L1710–1712, 1994). Further, it is known that similar quantum dots can be formed also by using an MOVPE (metal-organic vapor phase epitaxy) process (Oshinowo, J., et al., Appl. Phys. Lett., 65(11), pp.1421–1423, 1994). Recently, self-assembled structures of closely stacked InAs islands grown on GaAs by an MBE process is reported by Nakata, et al., J. Crystal Growth 175/176 (1997), pp.713–719.

As the formation of the quantum dots in such a strained heteroepitaxial system is controlled by a strain induced at the heteroepitaxial interface, the formation of the quantum dots is much easier than the conventional process of forming a semiconductor quantum dot structure. In addition, the foregoing process is advantageous in the point that there is no need for conducting a patterning process such as an electron-beam lithography for forming the quantum dots, and that the quantum dots thus formed are substantially free from damage.

Therefore, it may be thought advantageous to use the heteroepitaxial semiconductor quantum dots thus formed on a semiconductor substrate for the non-linear optical medium of a non-linear optical device. In the quantum dots thus formed on a semiconductor substrate, the problem of electron-photon interaction is substantially suppressed as compared with the case of the quantum dots that use organic molecules.

However, conventional quantum dots, including those formed by the foregoing S-K mode, are not well controlled asymmetrically about a point of inversion (inversion asymmetry) and thus cannot be used effectively for a device that uses a second-order non-linear optical effect such as Pockels effect. As is well known in the art, the medium should not have a point symmetry or inversion symmetry in order to show a second-order non-linear optical effect. Thus, such conventional quantum dots cannot be used for devices that use a large non-linear optical effect such as an optical switch of an optical waveguide, an optical spatial modulator, optical filter or an optical modulator.

SUMMARY OF THE INVENTION

Accordingly, it is a general object of the present invention to provide a novel and useful non-linear optical device wherein the foregoing problems are eliminated.

Another and more specific object of the present invention is to provide a non-linear optical device that shows a large non-linear optical effect by using quantum dots in an active part thereof, wherein the adverse effect of electron-photon interaction is minimized.

Another object of the present invention is to provide a non-linear optical device, comprising:
a semiconductor substrate;
a semiconductor layer of a first semiconductor material formed on said semiconductor substrate, said semiconductor layer passing an optical beam therethrough;
a plurality of quantum dots of a second semiconductor material having a bandgap smaller than a bandgap of said first semiconductor material, said plurality of quantum dots being formed in said semiconductor layer with a mutual spatial separation; and
an electrode provided on said semiconductor layer,
each of said plurality of quantum dots having an electron cloud that is modulated in a direction perpendicular to a principal surface of said semiconductor substrate.

Another object of the present invention is to provide a non-linear optical device, comprising:
a semiconductor substrate;
a semiconductor layer of a first semiconductor material formed on said semiconductor substrate, said semiconductor layer passing an optical beam therethrough;
a plurality of quantum dots of a second semiconductor material having a bandgap smaller than a bandgap of said first semiconductor material, said plurality of quantum dots being formed in said semiconductor layer with a mutual spatial separation; and
an electrode provided on said semiconductor layer,
each of said plurality of quantum dots having a uniform composition;
said plurality of quantum dots collectively changing a composition in a direction perpendicular to a principal surface of said semiconductor substrate.

Another object of the present invention is to provide a non-linear optical device, comprising:
a semiconductor substrate;
a semiconductor layer of a first semiconductor material formed on said semiconductor substrate, said semiconductor layer passing an optical beam therethrough;
a plurality of quantum dots of a second semiconductor material having a bandgap smaller than a bandgap of said first semiconductor material, said plurality of quantum dots being formed in said semiconductor layer with a mutual spatial separation; and
an electrode provided on said semiconductor layer,
each of said plurality of quantum dots being sandwiched by first and second barrier layers in a direction perpendicular to a principal surface of said semiconductor substrate,
said first and second barrier layers having respective dopings different from each other.

Another object of the present invention is to provide a non-linear optical device, comprising:
a semiconductor substrate;
a semiconductor layer of a first semiconductor material formed on said semiconductor substrate, said semiconductor layer passing an optical beam therethrough;
a plurality of quantum dots of a second semiconductor material having a bandgap smaller than a bandgap of said first semiconductor material, said plurality of quantum dots being formed in said semiconductor layer with a mutual spatial separation; and
an electrode provided on said semiconductor layer,
each of said plurality of quantum dots having a composition that changes therein in a direction perpendicular to a principal surface of said semiconductor substrate from a first side of said quantum dot to an opposite side of said quantum dot.

According to the present invention, the semiconductor layer forming the active part of the non-linear optical device is formed with asymmetry, by modulating the composition or doping of the semiconductor quantum dots. Thereby, the wavefunction of the quantum dots has a significantly different shape when the quantum state is different, and the non-linear optical device shows a very large second-order non-linear optical effect. As the quantum dots are formed of a semiconductor material, the non-linear optical device of the present invention is substantially free from the problem of decrease of the non-linear optical effect which is caused in the case of organic quantum dots by the electron-phonon interaction.

Another object of the present invention is to provide a non-linear optical device, comprising:
a semiconductor substrate;
a semiconductor layer of a first semiconductor material formed on said semiconductor substrate, said semiconductor layer passing an optical beam therethrough;
a plurality of quantum dots of a second semiconductor material having a bandgap smaller than a bandgap of said first semiconductor material, said plurality of quantum dots being formed in said semiconductor layer with a mutual spatial separation; and
an optical window provided on said semiconductor layer for passing an optical beam therethrough such that said optical beam reaches said plurality of quantum dots,
each of said plurality of quantum dots having a composition that changes symmetrically therein in a direction perpendicular to a principal surface of said semiconductor substrate.

According to the present invention, it is possible to provide a non-linear optical device that uses a third-order non-linear optical effect. The non-linear optical device is controlled by a control optical beam.

Another object of the present invention is to provide a non-linear optical device, comprising:
a semiconductor substrate;

a semiconductor layer of a first semiconductor material formed on said semiconductor substrate, said semiconductor layer passing an optical beam therethrough;

a plurality of quantum dots of a second semiconductor material having a bandgap smaller than a bandgap of said first semiconductor material, said plurality of quantum dots being formed in said semiconductor layer with a mutual spatial separation; and an optical window provided on said semiconductor layer for passing an optical beam therethrough such that said optical beam reaches said plurality of quantum dots, each of said plurality of quantum dots including a plurality of quantum dots aligned in a direction substantially perpendicular to a principal surface of said substrate and having mutually different quantum levels.

According to the present invention, the optically excited electrons and holes are spatially separated by forming a plurality of quantum dots having respective quantum levels such that the plurality of quantum dots are aligned in the vertical direction. As the spatially separated electrons and holes thus created apply an electric field to the quantum dots, the non-linear optical device of the present invention shows a second-order non-linear optical effect. In other words, the non-linear optical device of the present invention shows a second-order non-linear optical effect induced by optical radiation.

Other objects and further features of the present invention will become apparent from the following detailed description when read in conjunction with the attached drawings.

DETAILED DESCRIPTION OF THE PREFERRED EMBODIMENTS

FIRST EMBODIMENT

Figure 2:
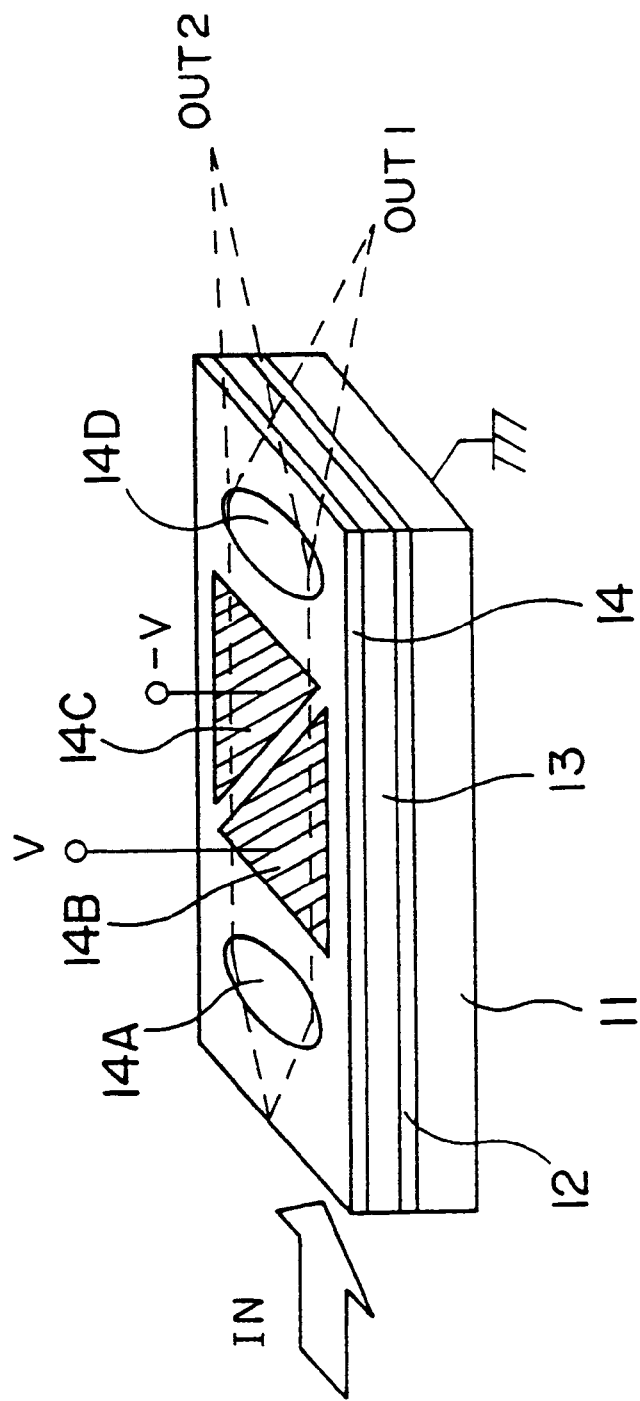
FIG. 2 is a diagram showing the construction of a non-linear optical semiconductor device according to a first embodiment of the present invention.

FIG. 2 shows the construction of a non-linear optical device according to a first embodiment of the present invention.

Referring to FIG. 2, the non-linear optical device 10 is constructed on a semiconductor substrate 11 which may be typically formed of n-type GaAs and includes a lower cladding layer 12 of n-type AlGaAs formed on the substrate 11 epitaxially, an active layer 13 formed on the lower cladding layer 12 epitaxially and an upper cladding layer 14 of p-type AlGaAs formed on the active layer 13 epitaxially, wherein the active layer 13 includes therein quantum dots to be explained in detail later. Further, the layered structure thus formed of the semiconductor layers 11–14 has an end surface to which an incoming optical beam is directed for an optical coupling with the active layer 13.

In the example of FIG. 2, there is further provided a lens electrode 14A on the upper cladding layer 14 adjacent to the foregoing incoming-side end surface for inducing a lens effect in the active layer 13 such that the lens thus induced converts the incoming divergent optical beam to a parallel optical beam. Further, the non-linear optical device 10 of FIG. 2 includes prism electrodes 14B and 14C on the upper cladding layer 14 such that the prism electrodes 14B and 14C induce a prism effect in the active layer 13 such that the parallel optical beam produced by the foregoing lens action is refracted. Furthermore, the non-linear optical device 10 includes another lens electrode 14C at an opposite end surface of the layered structure from which the optical beam goes out, wherein the lens electrode 14C induces a lens effect in the active layer 13 such that the refracted parallel optical beam is converted to a convergent outgoing optical beam.

In operation, the substrate 11 is grounded and control voltages are applied to the prism electrodes 14B and 14C. In response to the control voltages, the optical path of the outgoing optical beam is switched between a first out-path $OUT_1$ and a second out-path $OUT_2$.

Figure 3:
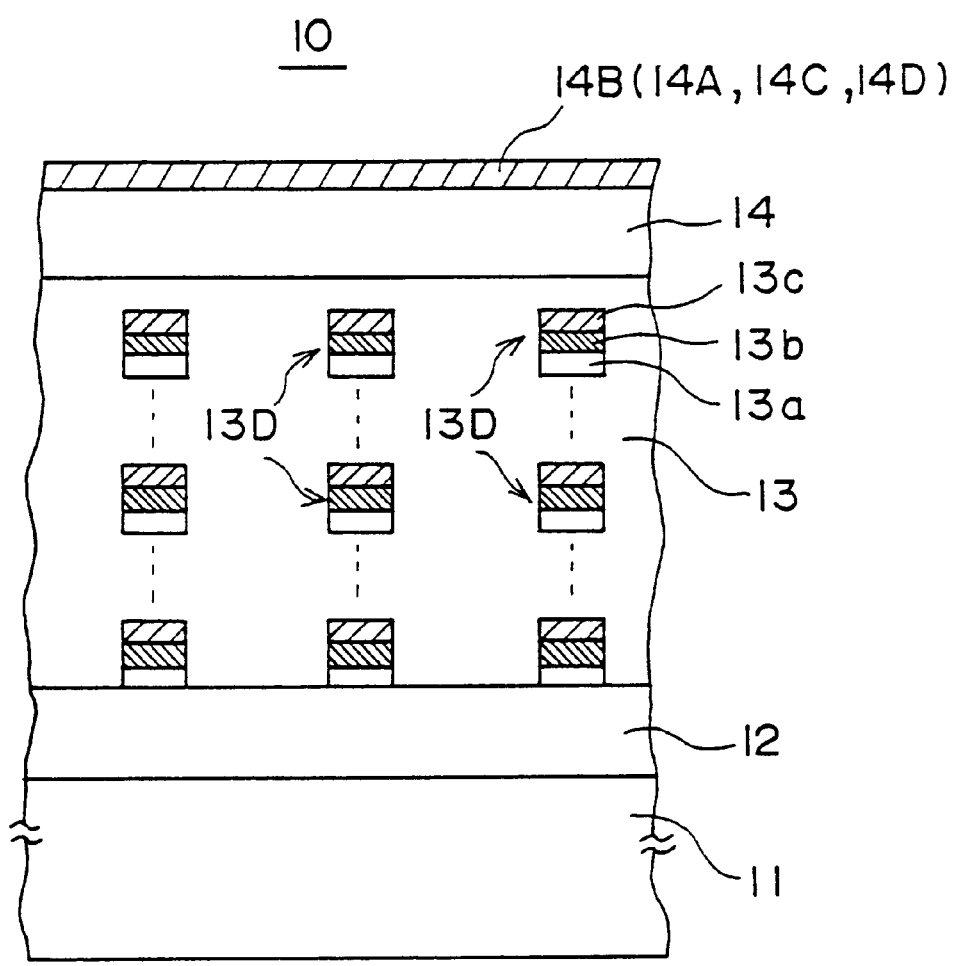
FIG. 3 is a cross-sectional diagram showing a part of the non-linear optical semiconductor device of FIG. 2 in detail.

FIG. 3 shows a cross section of the non-linear optical device 10 of FIG. 2. In FIG. 3, those parts corresponding to the parts described previously are designated by the same reference numerals and the description thereof will be omitted.

Referring to FIG. 3, the active layer 13 is typically formed of an undoped GaAs and contains a number of quantum dots 13D isolated from each other, wherein each of the quantum dots 13D has a size of a de Broglie wavelength of carriers or smaller. In the illustrated example of FIG. 3, the quantum dots 13D are aligned in a direction substantially perpendicular to the substrate 11, and each of the quantum dots 13D in fact is formed of smaller mini-quantum dots 13a–13c which are different from each other in one way or another.

Figure 1:
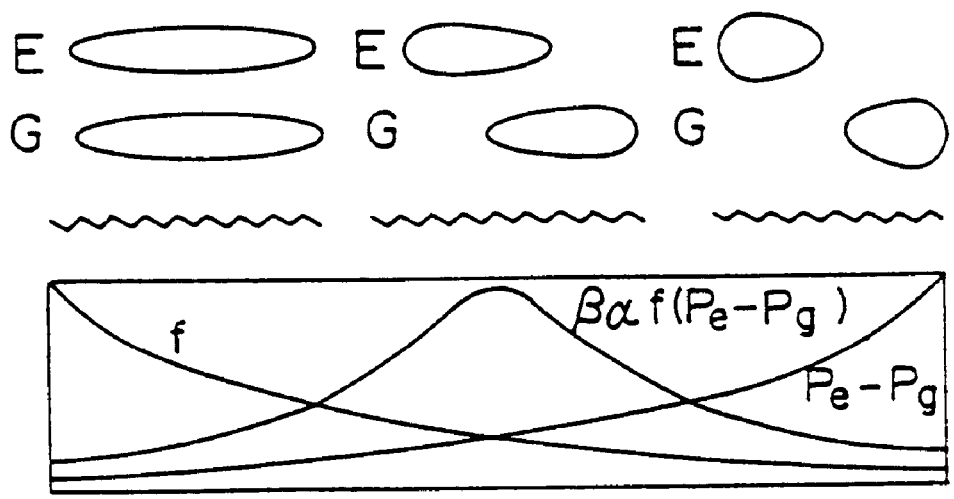
FIG. 1 is a diagram explaining the relationship between non-linear optical effect and quantization.
Figure 4A:
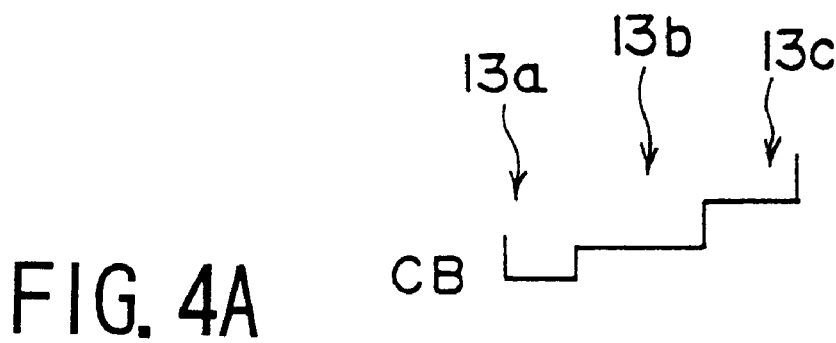
FIGS. 4A–4C are diagrams showing various band structures of a quantum dot.

For example, each of the mini-quantum dots 13a–13c may be formed of a semiconductor material having a composition such that the composition changes consecutively from one mini-quantum dot to the other mini-quantum dot in the direction perpendicular to the substrate 11. Thereby, the inversion symmetry disappears as a whole from the quantum dot 13D. FIG. 4A for example shows a step-like band diagram of the quantum dot 13D for a case in which the mini-quantum dots 13a, 13b and 13c have the compositions of InAs, $(InAs)_{0.5}(GaSb)_{0.5}$ and GaSb. As will be noted in FIG. 4A, the band structure changes consecutively in an asymmetrical manner in a z-direction which is perpendicular to the principal surface of the substrate 11. In FIG. 4A, it should be noted that $C_B$ represents a conduction band while $V_B$ represents a valence band. As a result of the band structure of FIG. 4A, the quantum dot 13D has a wavefunction, and hence an associated electron cloud, that is asymmetric in the z-direction as explained with reference to FIG. 1. Thereby, the active layer 13 shows a conspicuous second-order non-linear optical effect.

Figure 4B:
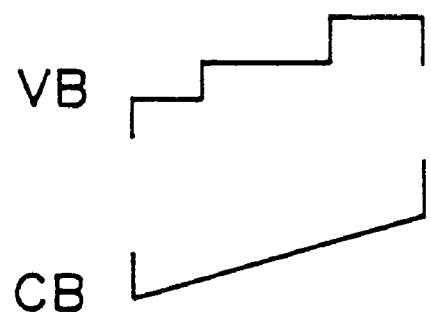

It should be noted that the foregoing stepwise compositional change of the mini-quantum dots 13a–13c of the quantum dot 13D may also be a continuous change. In this case, a band structure shown in FIG. 4B may be obtained for the quantum dot 13D. It should be noted that the band structure of FIG. 4B is also asymmetric in the z-direction.

Figure 4C:
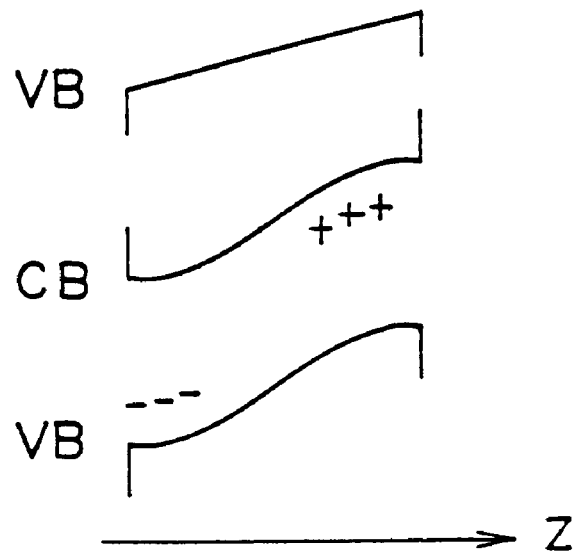

Further, the doping of the quantum dot 13D may be made asymmetric as indicated in FIG. 4C. In the case of FIG. 4C, the mini-quantum dot 13b is undoped while the mini-quantum dot 13a is doped to the n-type. Further, the mini-quantum dot 13c is doped to the p-type.

Figure 5A:
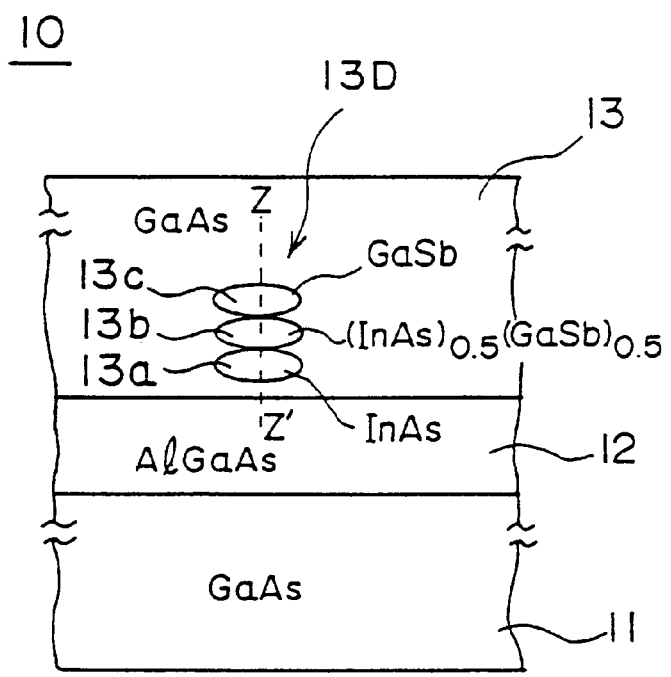
FIGS. 5A and 5B are diagrams showing the quantum dots in FIG. 3 in detail.

FIG. 5A shows the quantum dot 13D of FIG. 4A in detail.

Referring to FIG. 5A, the lower cladding layer 12 of AlGaAs forms a buffer layer that achieves a lattice matching to the GaAs substrate 11, and the mini-quantum dot 13a is formed on the foregoing buffer layer 12 by depositing an InAs layer that forms a strained system with respect to the underlying AlGaAs buffer layer 12, by an epitaxial process such as an MOVPE process. Thereby, the InAs layer thus deposited forms a number of disk-like mini-quantum dots 13a typically having a diameter of about 20 nm and a height of about 20 nm as a result of the island growth that occurs in the initial period of the S-K mode growth as is well known in the art of strained heteroepitaxial growth.

The InAs mini-quantum dots 13a thus formed are then covered by a thin GaAs layer forming a part of the active layer 13, and the mini-quantum dots 13b now having the foregoing composition of $(InAs)_{0.5}(GaSb)_{0.5}$ are formed further thereon by depositing a layer of $(InAs)_{0.5}(GaSb)_{0.5}$ by a similar epitaxial process and associated island-growth. Thereby, the mini-quantum dots 13b are formed with a diameter and a height similar to those of the mini-quantum dots 13a. It should be noted that the mini-quantum dots $(InAs)_{0.5}(GaSb)_{0.5}$ also form a strained heteroepitaxial system with respect to the GaAs substrate 11 similarly to the mini-quantum dots 13a of InAs.

It should be noted that it is preferable to set the thickness of the thin GaAs layer covering the mini-quantum dots 13a to be generally equal to or even less than the height of the mini-quantum dots 13a. For example, the GaAs layer may be formed with a thickness of about 3 nm or less. When the InAs mini-quantum dots 13a are thus covered by such a very thin GaAs layer, the crystal structure of the GaAs layer is deformed substantially by the underlying InAs mini-quantum dots 13a, and the $(InAs)_{0.5}(GaSb)_{0.5}$ mini-quantum dots 13b formed on the GaAs layer grow preferentially on the part where the GaAs layer is deformed the most. In other words, the mini-quantum dots 13b are formed in alignment with the mini-quantum dots 13a. Reference should be made to S. Sugiyama, et al, Jpn. J. Appl. Phys. 35, Part 1, no.28, pp.365–369, February, 1996 with regard to such a spontaneous alignment of the self-organized quantum dots.

The foregoing mini-quantum dots 13b are then covered by a thin GaAs layer similarly to the mini-quantum dots 13a, wherein the vertically aligned quantum dots 13a–13c are coupled with each other quantum mechanically to form an effectively single quantum dot 13D. The quantum dot 13D, however, is different from the conventional, ordinary quantum dots in that the quantum dot 13D has an effectively asymmetric internal structure. The mini-quantum dots 13a–13c may be formed by any of MBE process, ALE process or MOVPE process.

In the case the thickness of the intervening GaAs layer is reduced to below about 3 nm, it should be noted that there is a possibility that the lower mini-quantum dots and the upper mini-quantum dots contact each other. Even in such a case, these upper and lower mini-quantum dots, such as the mini-quantum dot 13a and the mini-quantum dot 13b, do not merge with each other and the mini-quantum dots are defined by respective surfaces.

Figure 5B:
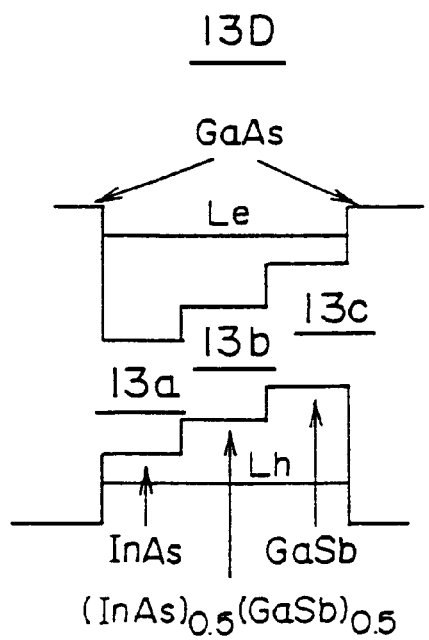

As a result of such a spontaneous alignment of the quantum dots, an asymmetric band structure shown in FIG. 5B is obtained for the quantum dot 13D of FIG. 5A. Thereby, it should be noted that the quantum level $L_e$ of the electrons and the quantum level $L_h$ of the holes are formed throughout the quantum dot 13D as a result of the quantum mechanical coupling of the mini-quantum dots 13a–13c. It should be noted that the band diagram of FIG. 5B shows the band structure along a line z–z' of FIG. 5A.

By increasing the number of stacks of the mini-quantum dots and decreasing the magnitude of the compositional change between the stacks, it is possible to obtain the band structure of FIG. 4B in which the band structure changes substantially continuously. On the other hand, the band structure of FIG. 4C is obtained by introducing p-type and n-type dopants such as Se and Zn simultaneously when forming the mini-quantum dots 13a and 13c by an MOVPE process. Further, the continuous band structure of FIG. 4B can also be achieved by using a multi-component system such as InGaAlAsPN for the mini-quantum dots 13a–13c and by adjusting the composition thereof such that the composition of the quantum dots 13a–13c changes substantially continuously.

In the structure of FIG. 5A in which the quantum dot 13D has an asymmetric internal structure in the z-direction, it is also possible to introduce a p-type dopant such as Zn when forming the mini-quantum dot 13a and introduce an n-type dopant such as Se when forming the mini-quantum dot 13c.

Further, it is also possible to introduce the same dopant with different concentration levels in the mini-quantum dots 13$a$ and 13$c$.

SECOND EMBODIMENT

Figure 6A:
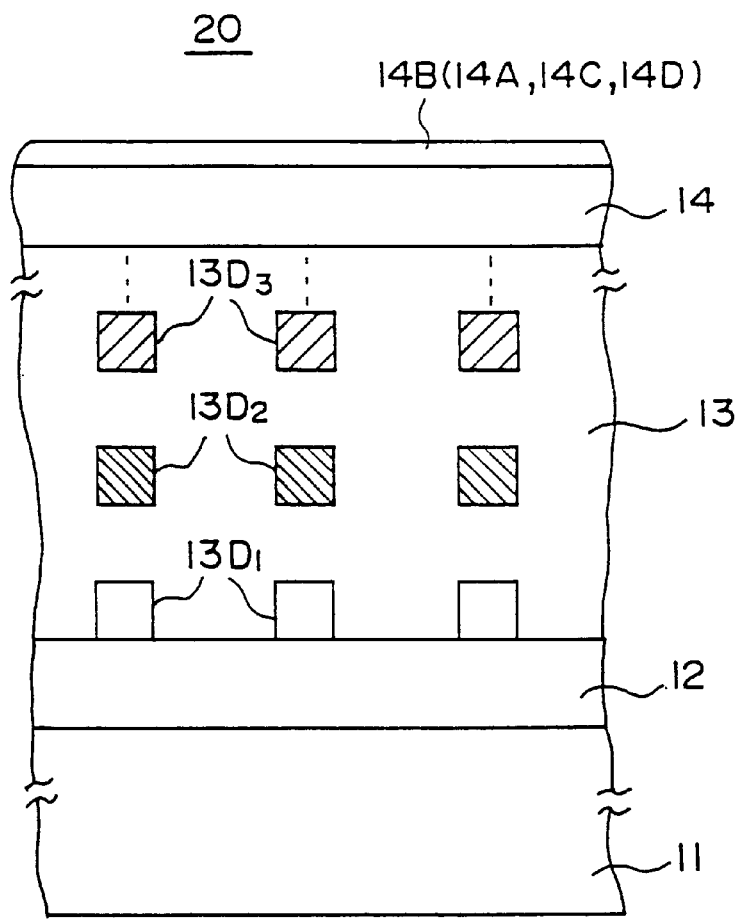
FIGS. 6A and 6B are respectively a cross-sectional diagram and a band diagram showing the construction of a non-linear optical device according to a second embodiment of the present invention.
Figure 6B:
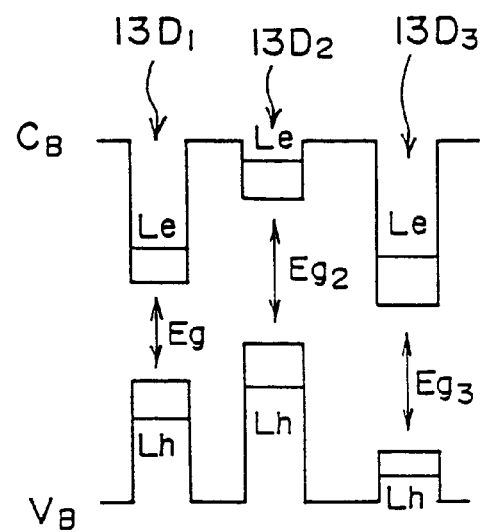

FIGS. 6A and 6B show the construction and band structure of a non-linear optical device 20 according to a second embodiment of the present invention, wherein those parts corresponding to the parts described previously are designated by the same reference numerals and the description thereof will be omitted.

Referring to FIGS. 6A, it will be noted that the non-linear optical device 20 includes quantum dots $13D_1$–$13D_3$ in the active layer 13 such that the quantum dots $13D_1$–$13D_3$ are aligned in the z-direction perpendicular to the principal surface of the substrate 11, wherein the quantum dots $13D_1$–$13D_3$ have respective compositions and hence respective band structures that change in the z-direction asymmetrically as indicated in the band diagram of FIG. 6B. In FIGS. 6B, it should be noted that the bandgap of the quantum dot $13D_1$ is represented by $Eg_1$, the bandgap of the quantum dot $13D_2$ is represented by $Eg_2$ and the bandgap of the quantum dot $13D_3$ is represented by $Eg_3$, wherein there holds a relationship $$Eg_1 < Eg_3 < Eg_2$$

in the example of FIG. 6B.

In the band diagram of FIG. 6B, the Fermi level is changed also in each quantum dot $13D_1$–$13D_3$. Thereby, the inversion symmetry is eliminated in the construction of FIG. 6A from the active layer 13 as a whole. Thus, the active layer 13 of FIG. 6A shows a desired conspicuous second-order non-linear optical effect.

It should be noted that the structure of FIGS. 6A and 6B can be formed for example by using $(InAS)_{0.5}(GaSb)_{0.5}$ for the quantum dot $13D_1$, GaSb for the quantum dot $13D_2$ and InAs for the quantum dot $13D_3$.

In the construction of FIG. 6A, the quantum dots $13D_1$–$13D_3$ are separated spatially from each other and thus do not form an effectively single quantum dot contrary to the quantum dot 13D of FIG. 5A in which the mini-quantum dots form a quantum mechanical coupling. Associated with this, each of the quantum dots $13_1$–$13D_3$ has quantum levels $L_e$ and $L_h$ pertinent thereto as represented in the band diagram of FIG. 6B. Even in such a case, one of the quantum dots such as the quantum dot $13D_2$ is influenced by the adjacent quantum dot $13D_1$ blow and the quantum dot $13D_3$ above, and the wavefunction, and hence the electron cloud, experiences an asymmetric deformation in the z-direction. Further, it should be noted that the quantum dots are aligned vertically also in the case of FIG. 6A in which the quantum dots $13D_1$–$13D_3$ are spaced apart. Thus, the construction of FIG. 6A is effective also in the case in which the quantum dots $13D_1$–$13D_3$ are separated from each other by a distance of several nanometers.

THIRD EMBODIMENT

Figure 7:
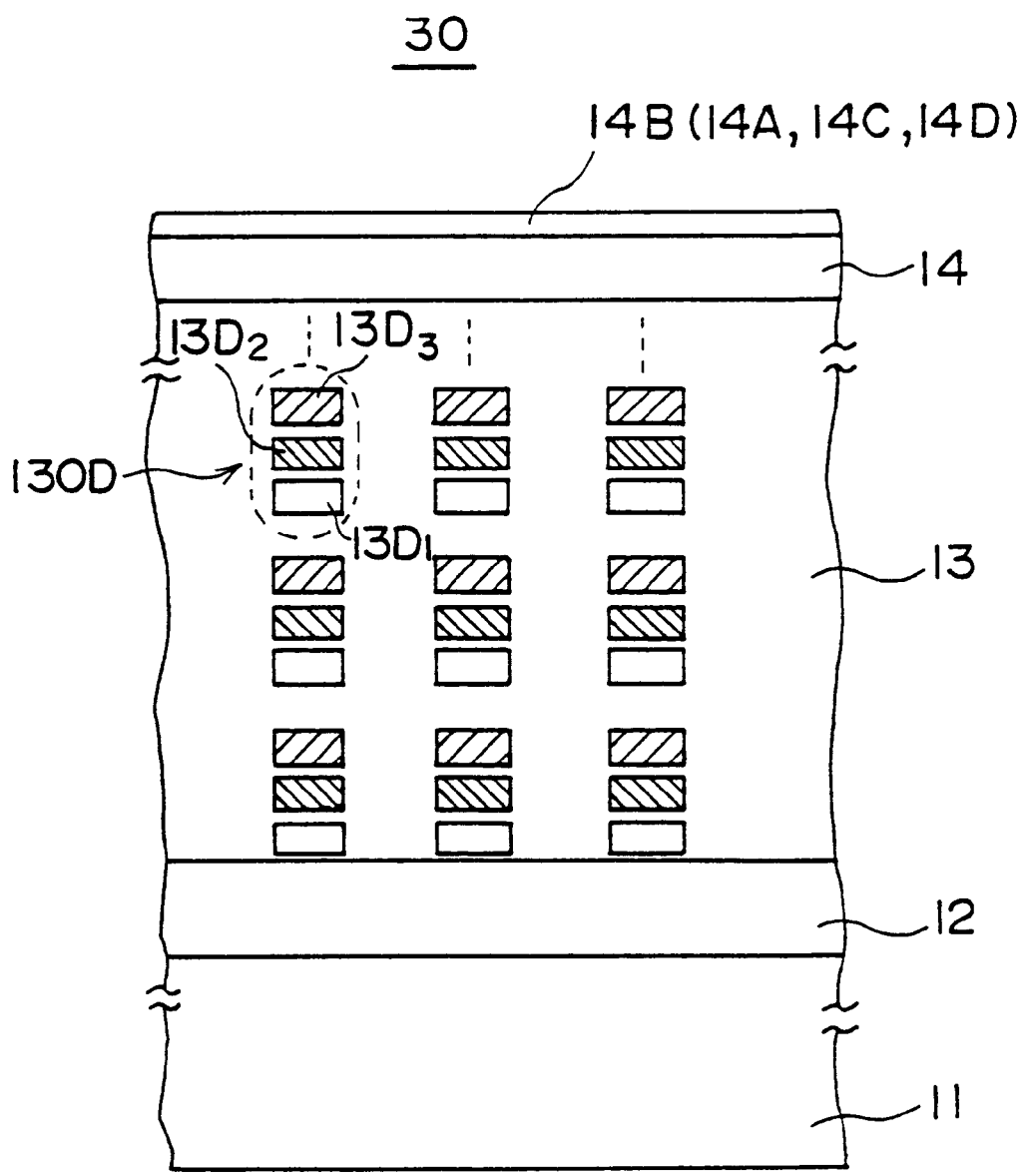
FIG. 7 is a cross-sectional diagram showing a part of a non-linear optical device according to a third embodiment of the present invention.

FIG. 7 shows the construction of a non-linear optical device 30 according to a third embodiment of the present invention, wherein those parts corresponding to the parts described previously are designated by the same reference numerals and the description thereof will be omitted.

Referring to FIG. 7, the illustrated structure is an intermediate structure between the construction of FIG. 5A and the construction of FIG. 6A in that the spatial separation between the quantum dots $13D_1$–$13D_3$ is reduced as compared with the structure of FIG. 6A. In this construction of FIG. 7, it should be noted that the quantum dots $13D_1$–$13D_3$ aligned in the z-direction perpendicular to the principal surface of the substrate are coupled with each other quantum mechanically to form a single super quantum dot structure 130D.

In the foregoing super quantum dot structure 130D, it should be noted that there is formed a GaAs barrier layer between adjacent quantum dots such as the quantum dot $13D_1$ and the quantum dot $13D_2$, wherein the GaAs barrier layer thus formed has a thickness equal to or larger than the height of the quantum dot $D_1$. In this case, too, the super quantum dot structure 130D has an internal structure asymmetric with respect to the z-direction and the active layer 13 shows a conspicuous non-linear optical effect.

FOURTH EMBODIMENT

Figure 8:
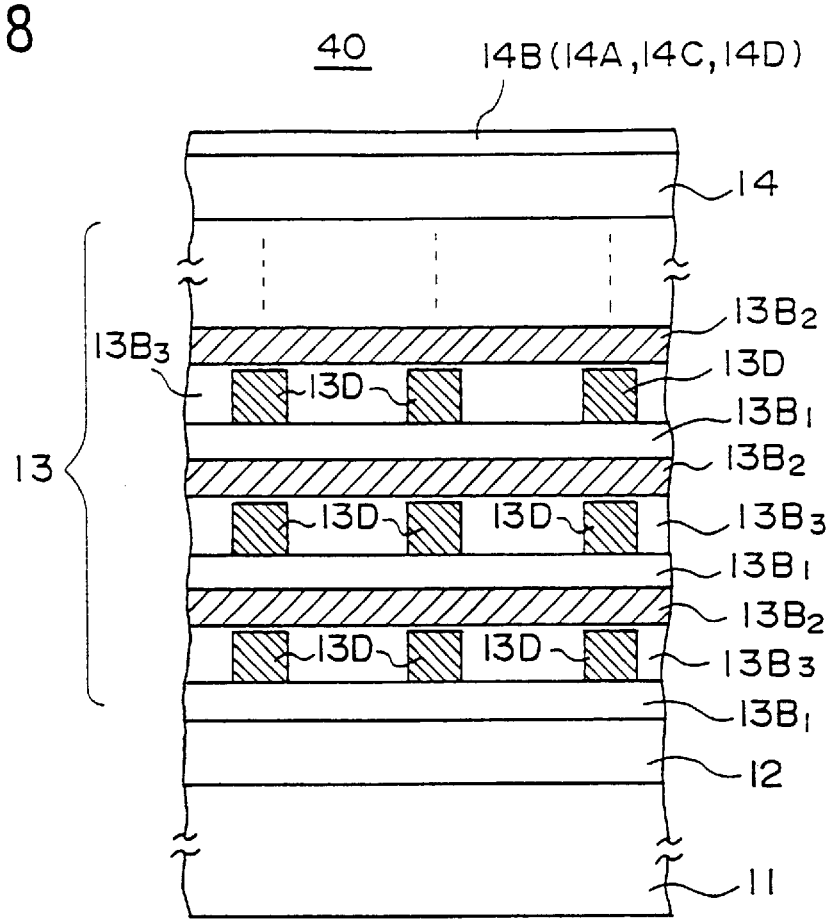
FIG. 8 is a cross-sectional diagram showing a part of a non-linear optical device according to a fourth embodiment of the present invention.

FIG. 8 shows the construction of a non-linear optical device 40 according to a fourth embodiment of the present invention, wherein those parts corresponding to the parts described previously are designated by the same reference numerals and the description thereof will be omitted.

Referring to FIG. 8, the lower cladding layer 12 carries a first barrier layer $13B_1$ of n-type GaAs or AlGaAs as a lowermost past of the active layer 13, and the quantum dots 13D of undoped InAs are formed on such a first barrier layer $13B_1$. The quantum dots 13D thus formed are then covered by a second barrier layer $13B_3$ of undoped GaAs or AlGaAs, and a third barrier layer $13_2$ of p-type GaAs or AlGaAs is provided further on the second barrier layer $13B_3$. Further, the structure including the layers $13B_1$–$13B_3$ and the quantum dots 13D are repeated a plurality of times in the active layer 13. In FIG. 8, it should be noted that the barrier layer $13B_3$ not only covers the quantum dots 13D but also fills the gap between the quantum dots 13D.

In the structure of FIG. 8, it should be noted that each of the quantum dots 13D is transfer-doped to the n-type by the electrons in the underlying first barrier layer $13B_1$ at the side facing the barrier layer $13B_1$ and further transfer-doped to the p-type by the holes in the overlying second barrier layer $13B_2$ at the side facing the barrier layer $13B_2$. See the band diagram of FIG. 9. Thereby, the doping of the quantum dot 13D becomes asymmetric in the z-direction and the active layer 13 containing the quantum dots 13D shows a conspicuous second-order non-linear optical effect.

In the construction of FIG. 8, it should be noted that a similar asymmetric modification of the band structure is possible for the quantum dot 13D by modifying the compositions of the barrier layers $13B_1$ and $13B_2$.

As other features of the present embodiment are substantially identical to those explained before, further description thereof will be omitted.

FIFTH EMBODIMENT

Figure 10:
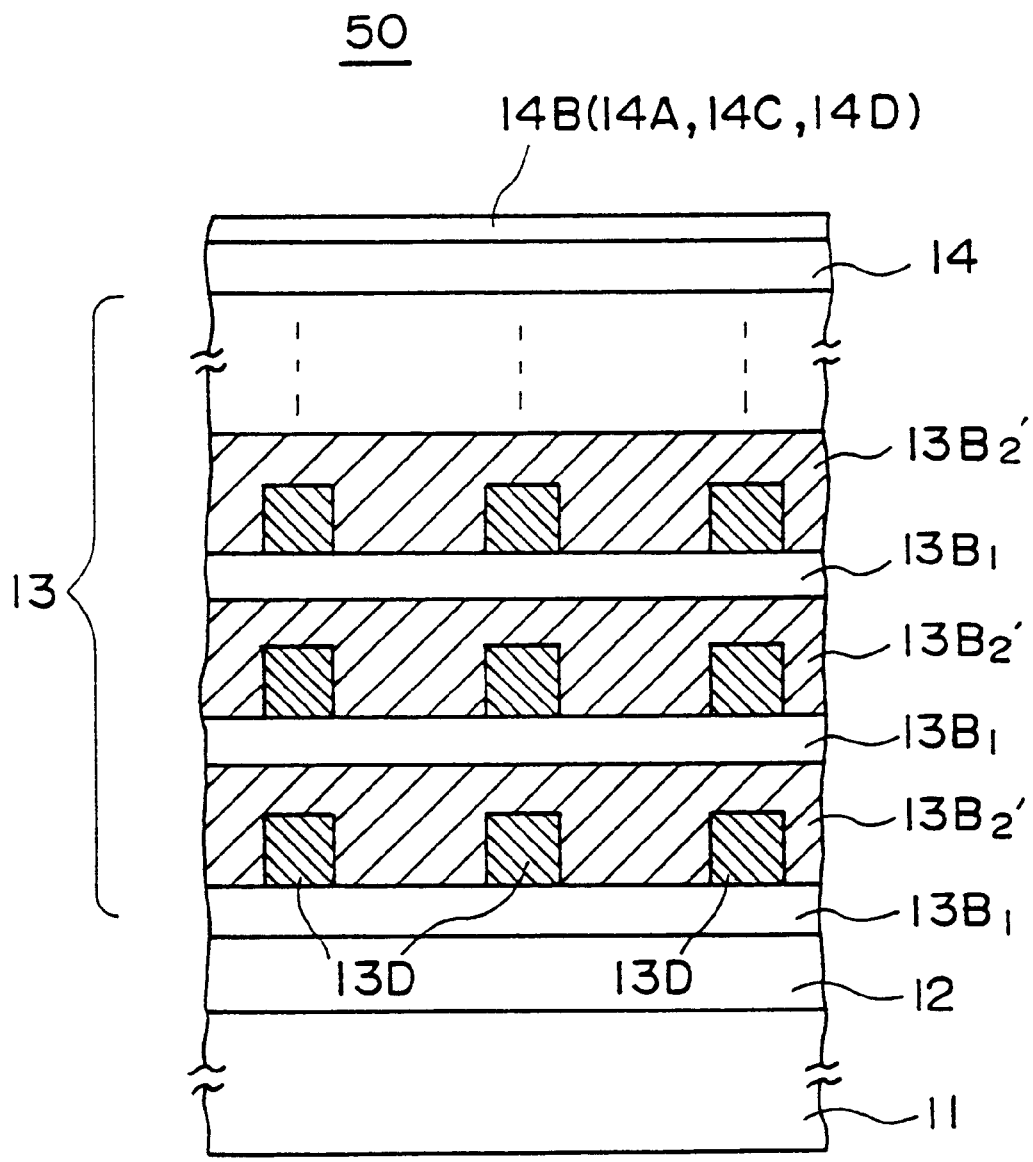
FIG. 10 is a cross-sectional diagram showing a part of a non-linear optical device according to a fifth embodiment of the present invention.

FIG. 10 shows the construction of a non-linear optical device 50 according to a fifth embodiment of the present invention, wherein those parts corresponding to the parts described previously are designated by the same reference numerals and the description thereof will be omitted.

Referring to FIG. 10, the non-linear optical device 50 is a modification of the non-linear optical device 40 of FIG. 8 in that the barrier layer $13B_2$ and the barrier layer $13B_3$ of FIG. 8 are formed of the same material. Thereby, the barrier layers $13B_2$ and $13B_3$ form a single barrier layer $13B_2'$.

In such a structure, therefore, each of the quantum dot 13D is vertically sandwiched by the barrier layers $13B_1$ and $13B_2'$. Thus, by changing the composition or doping between the barrier layers $13B_1$ and $13B_2$, it is possible to modify the wavefunction of the quantum dot 13D to become asymmetric in the z-direction.

As other features of the present embodiment are substantially identical to those explained before, further description thereof will be omitted.

SIXTH EMBODIMENT

Figure 11:
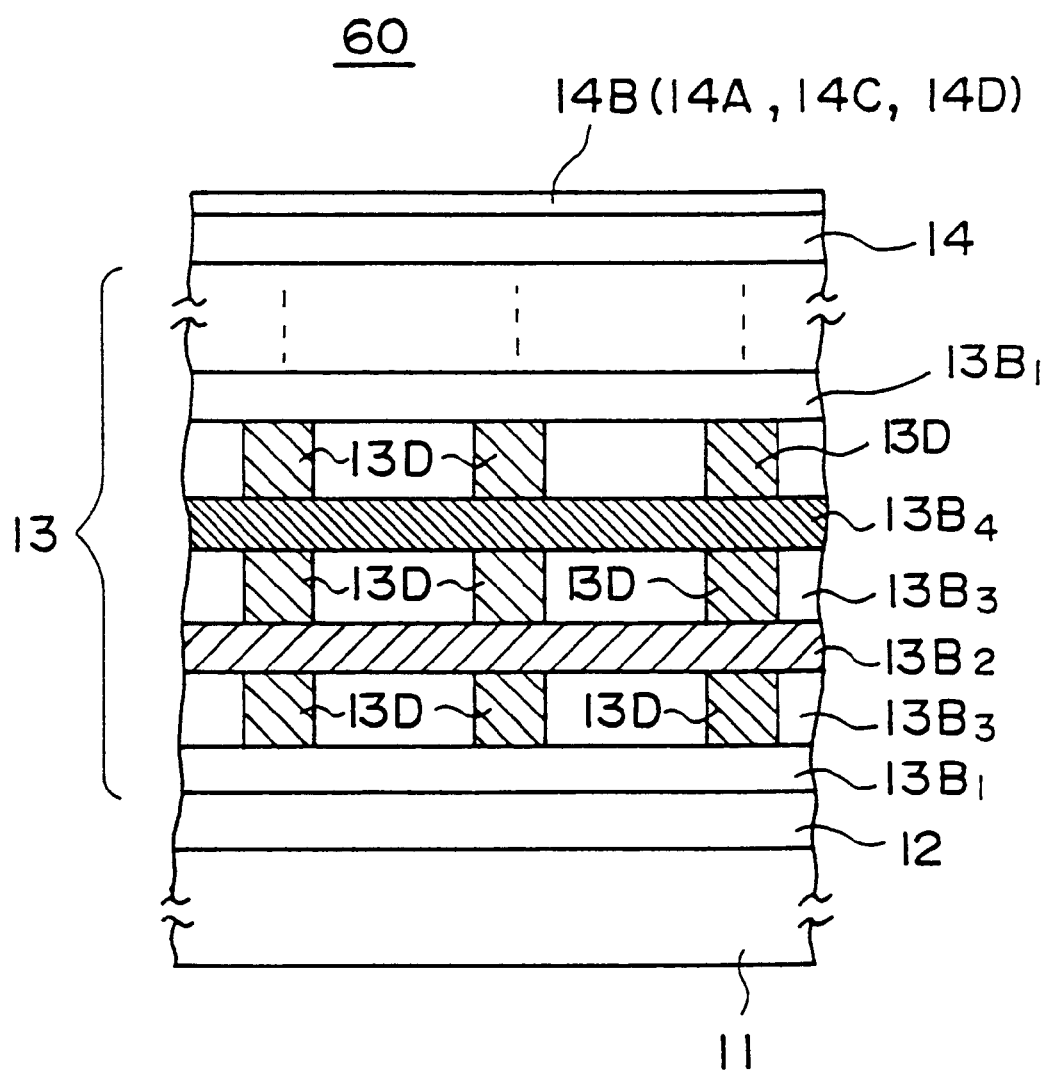
FIG. 11 is a cross-sectional diagram showing a part of a non-linear optical device according to a sixth embodiment of the present invention.

FIG. 11 shows the construction of a non-linear optical device 60 according to a sixth embodiment of the present invention, wherein those parts corresponding to the parts described previously are designated by the same reference numerals and the description thereof will be omitted.

Referring to FIG. 11, the non-linear optical device 60 is a modification of the non-linear optical device 40 described previously and includes a barrier layer $13B_4$ that is provided on the barrier layer $13B_3$ covering the quantum dot 13D.

Figure 9:
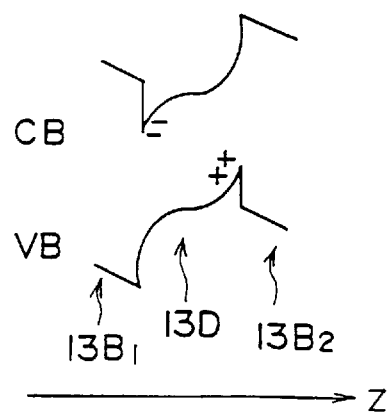
FIG. 9 is a band diagram showing the band structure of the quantum dot of FIG. 8.

In the present embodiment, too, it is possible to modify the band structure of the quantum dot 13D asymmetrically in the z-direction as indicated in FIG. 9, by modulating the composition or doping of the barrier layers $13B_1$–$13B_4$. For example, it is possible to form the barrier layers $13B_1$–$13B_4$ by a multicomponent compound semiconductor material such as InGaAlAsPN or InGaAlAsN and change the composition thereof in each of the layers $13B_1$–$13B_4$ within a range in which a satisfactory lattice matching is achieved with respect to the GaAs substrate 11. Alternatively, it is possible to form all the barrier layers $13B$–$13B_4$ by a common compound semiconductor material such as AlGaAs having a common composition and changing the doping or conductivity type in the barrier layers $13B_1$–$13B_4$ such that the doping or conductivity type changes from one barrier layer to another barrier layer.

SEVENTH EMBODIMENT

Figure 12:
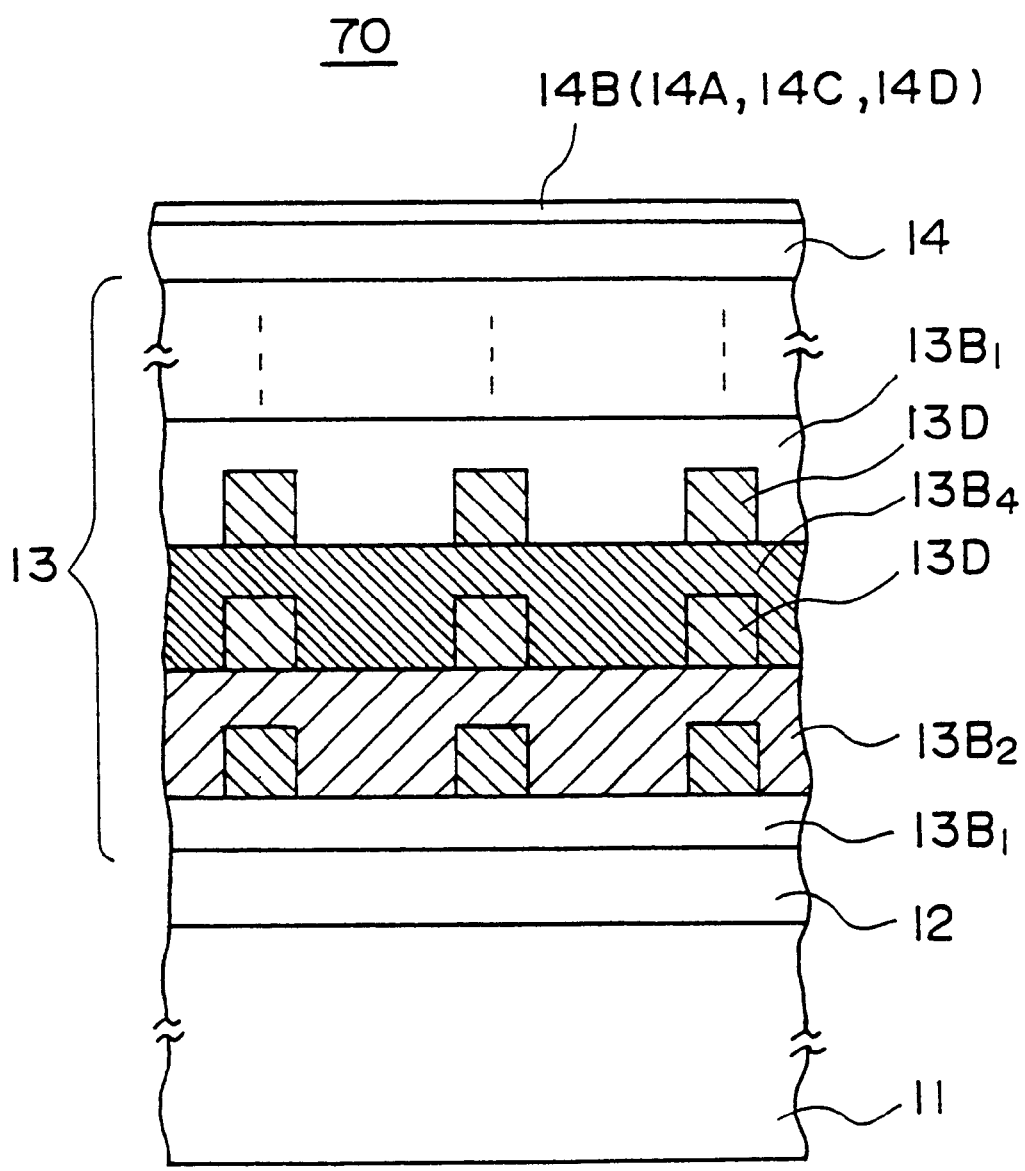
FIG. 12 is a cross-sectional diagram showing a part of a non-linear optical device according to a seventh embodiment of the present invention.

FIG. 12 shows the construction of a non-linear optical device 70 according to a seventh embodiment of the present invention, wherein those parts corresponding to the parts described previously are designated by the same reference numerals and the description thereof will be omitted.

Referring to FIG. 12, the non-linear optical device 70 is a modification of the non-linear optical device 60 described previously and has a construction in which the barrier layer $13B_3$ located underneath the barrier layer $13B_2$ and covering the quantum dot 13D is formed of a material identical to the material forming the barrier layer $13B_2$. Further, the barrier layer $13B_3$ located underneath the barrier layer $13B_4$ and covering the quantum dot 13D is formed of a material identical to the material forming the barrier layer $13B_4$. Further, the quantum dot 13D provided on the barrier layer $13B_4$ is covered by the barrier layer $13B_1$.

In such a construction, too, it is possible to modulate the wavefunction of the quantum dot 13D to become asymmetric in the z-direction, by modifying the composition or doping of the barrier layers $13B_1$–$13B_4$ asymmetrically in the z-direction.

EIGHTH EMBODIMENT

Figure 13:
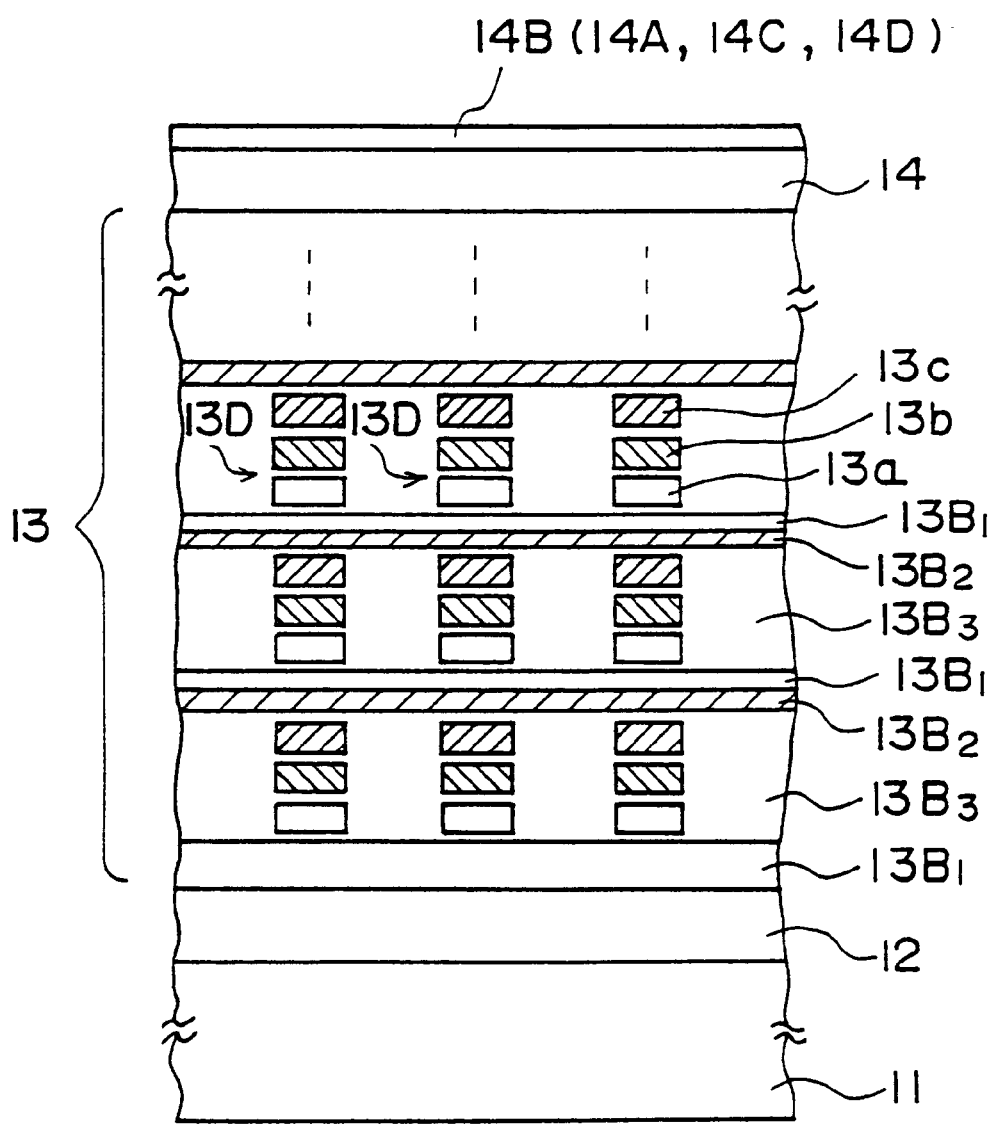
FIG. 13 is a cross-sectional diagram showing a part of a non-linear optical device according to an eighth embodiment of the present invention.

FIG. 13 shows the construction of a non-linear linear optical device 80 according to an eighth embodiment of the present invention, wherein those parts corresponding to the parts described previously are designated by the same reference numerals and the description thereof will be omitted.

Referring to FIG. 13, the non-linear optical device 80 has a construction in which the feature of the non-linear optical device 10 of FIG. 3 is combined with the feature of the non-linear optical device 40 of FIG. 8. As a result, the asymmetry of the quantum dot 13D in the z-direction is further enhanced by the asymmetry of the barrier layers $13B_1$ and $13B_2$.

As other features of the present invention are substantially identical to those described before, further description thereof will be omitted.

NINTH EMBODIMENT

Figure 14A:
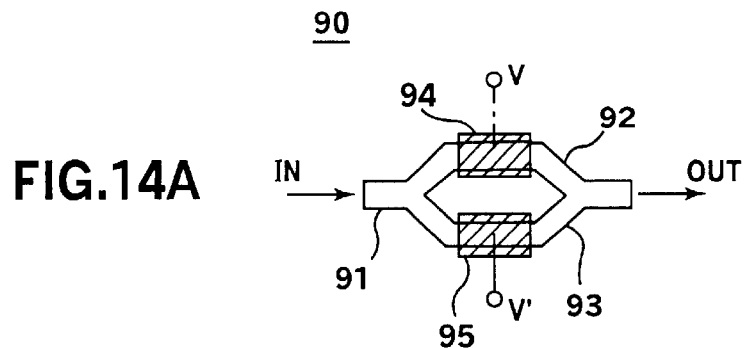
FIGS. 14A–14(D) are diagrams showing the construction of non-linear optical devices according to ninth through eleventh embodiments of the present invention.

FIG. 14A shows the construction of an optical modulator 90 according to a ninth embodiment of the present invention.

Referring to FIG. 14A, the optical modulator 90 has a Mach-Zehnder optical waveguide 91 having a first branch 92 and a second branch 93, wherein the optical waveguide 91 has a cross-sectional structure described in any of the preceding embodiments. The first branch 92 carries thereon a first electrode 94 while the second branch 93 carries thereon a second electrode 95.

In the optical modulator 90 of FIG. 14A, the active layer provided in the optical waveguide 91 in correspondence to the active layer 13 exhibits a second-order non-linear optical effect due to the asymmetric quantum dots included therein. Thus, the refractive index is modified in the optical branches 92 and 93 in response to the control voltage V or V' applied to the electrode 94 or 95. Thereby, an incoming optical signal IN injected to the optical waveguide 91 at an optical input end experiences a phase modulation as the optical signal passes through the foregoing branches 92 and 93 in the form of two optical beams, wherein the two optical beams thus experienced the phase modulation cause an interference in an optical output end of the optical waveguide 91. It should be noted that the optical modulator 90 can be used also as an optical filter.

TENTH EMBODIMENT

Figure 14B:
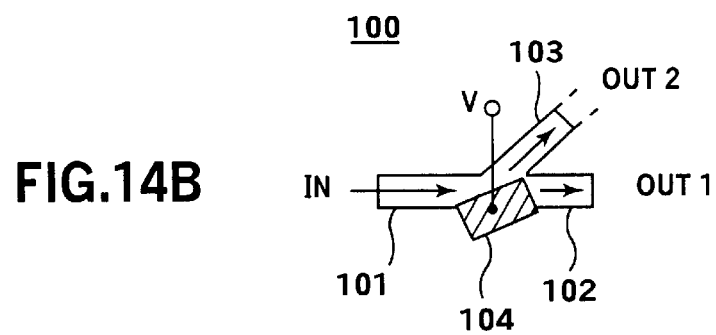

FIG. 14B shows the construction of an optical switch 100 according to a tenth embodiment of the present invention.

Referring to FIG. 14B, the optical switch 100 is formed of a Y-shaped optical waveguide 101 having a cross-sectional structure described in any of the preceding embodiments, wherein the optical waveguide 101 carries an electrode 104 at a location where optical branches 102 and 103 forming a part of the Y-shaped optical waveguide 101 merge with each other.

In such a construction, it should be noted that the optical waveguide 101, including therein the asymmetric quantum dots, exhibit a conspicuous second-order optical non-linear effect. Thus, the refractive index of the optical waveguide 101 is controlled in response to a control voltage signal V applied to the electrode 104 at the part thereof where the foregoing optical waveguide branch 102 and the optical waveguide branch 103 merge with each other. As a result, it is possible to switch the optical path of an incoming optical signal between an output end $OUT_1$ and an $OUT_2$ by the control voltage applied to the electrode 104.

ELEVENTH EMBODIMENT

Figure 14C:
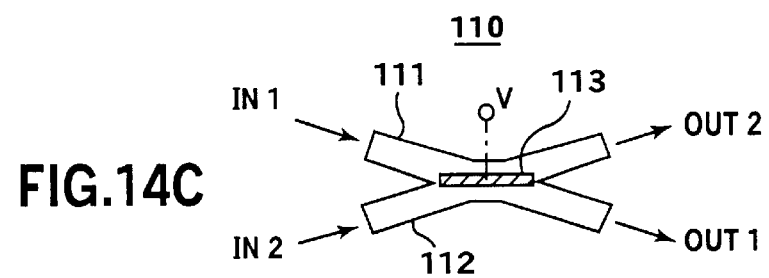

FIG. 14C shows the construction of an optical matrix switch according to an eleventh embodiment of the present invention.

Referring to FIG. 14C, the optical matrix switch 110 includes optical waveguide branches 111 and 112 crossing with each other and has a cross-sectional structure described in any of the preceding embodiments. Further, an electrode 113 is provided on an intersecting part of the optical waveguide branches 111 and 112. Similarly to the previous embodiments, the optical waveguide branches 111 and 112, including an active layer in which asymmetric quantum dots are formed, exhibit a conspicuous second-order non-linear optical effect.

Thus, it is possible to switch the optical path of the optical beams incident to optical input ends $IN_1$ and $IN_2$ of the optical waveguide branches 111 and 112 between optical output ends $OUT_1$ and $OUT_2$.

Figure 14D:
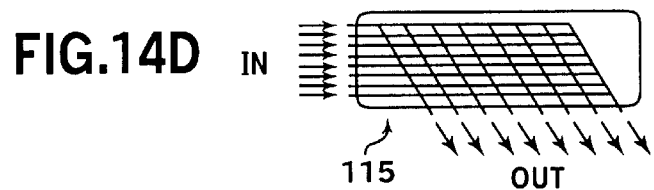

The optical matrix switch 110 of the present embodiment has a simple construction and can be successfully used for a node of an optical matrix structure 115 in which a number of optical waveguides intersect with each other, as shown in FIG. 14D. Further, the optical matrix switch 110 can also be used for an optical spatial modulator as will be described later. In such an optical spatial modulator, the optical beam traveling across a layer is modulated by changing the refractive index of an active layer.

TWELFTH EMBODIMENT

In the embodiments described heretofore, the active layer has been bestowed with the second-order non-linear optical effect by forming the quantum dots 13D to have an asymmetry in the direction perpendicular to the substrate 11.

On the other hand, it is possible to form the active layer 13 to have a third-order non-linear optical effect (optical Kerr effect) by forming the quantum dots 13D symmetrically in the z-direction. It is known that a quantum dot having no asymmetry in the internal structure generally shows such a third-order non-linear optical effect. On the other hand, the third-order non-linear effect can be enhanced further by intentionally forming a symmetrical internal structure in the quantum dot.

FIGS. 15A–15D show a band structure that enhances such a third-order non-linear optical effect, wherein the quantum dot 13D itself has a construction shown in FIG. 5A and the description thereof will be omitted.

Figure 15A:
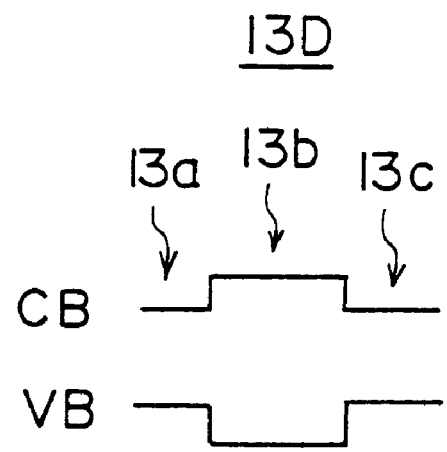
FIGS. 15A–15(D) are band diagrams showing the band structure of a quantum dot used in a non-linear optical device according to a twelfth embodiment of the present invention.

Referring to the band structure of FIG. 15A, the quantum dot 13D includes the mini-quantum dots 13a–13c of InGaAs formed on the GaAs substrate 11 similarly to the quantum dot 13D of FIG. 5A, except that the composition of the mini-quantum dots 13a–13c are changed symmetrically in the z-direction. For example, the mini-quantum dots 13a and 13c may be formed to have a composition $In_{0.9}Ga_{0.1}As$ while the mini-quantum dot 13b may be formed to have a composition of $In_{0.8}Ga_{0.2}As$.

Figure 15B:
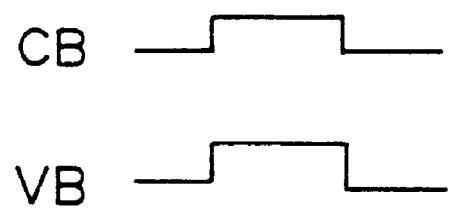

In the band structure of FIG. 15B, on the other hand, the quantum dot 13D includes the mini-quantum dots 13a and 13c of InAs in addition to the mini-quantum dot 13b, which now has a composition of $(AlAsSb)_{0.39}(GaAsSb)_{0.81}$.

Figure 15C:
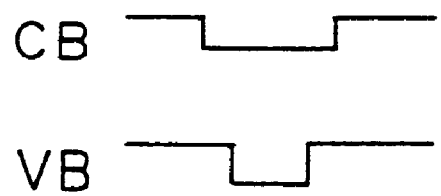
Figure 15D:
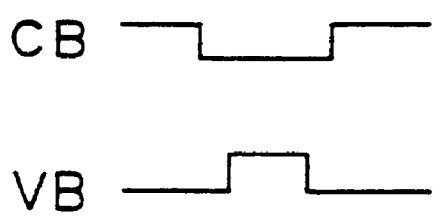
Figures 16A, 16B:
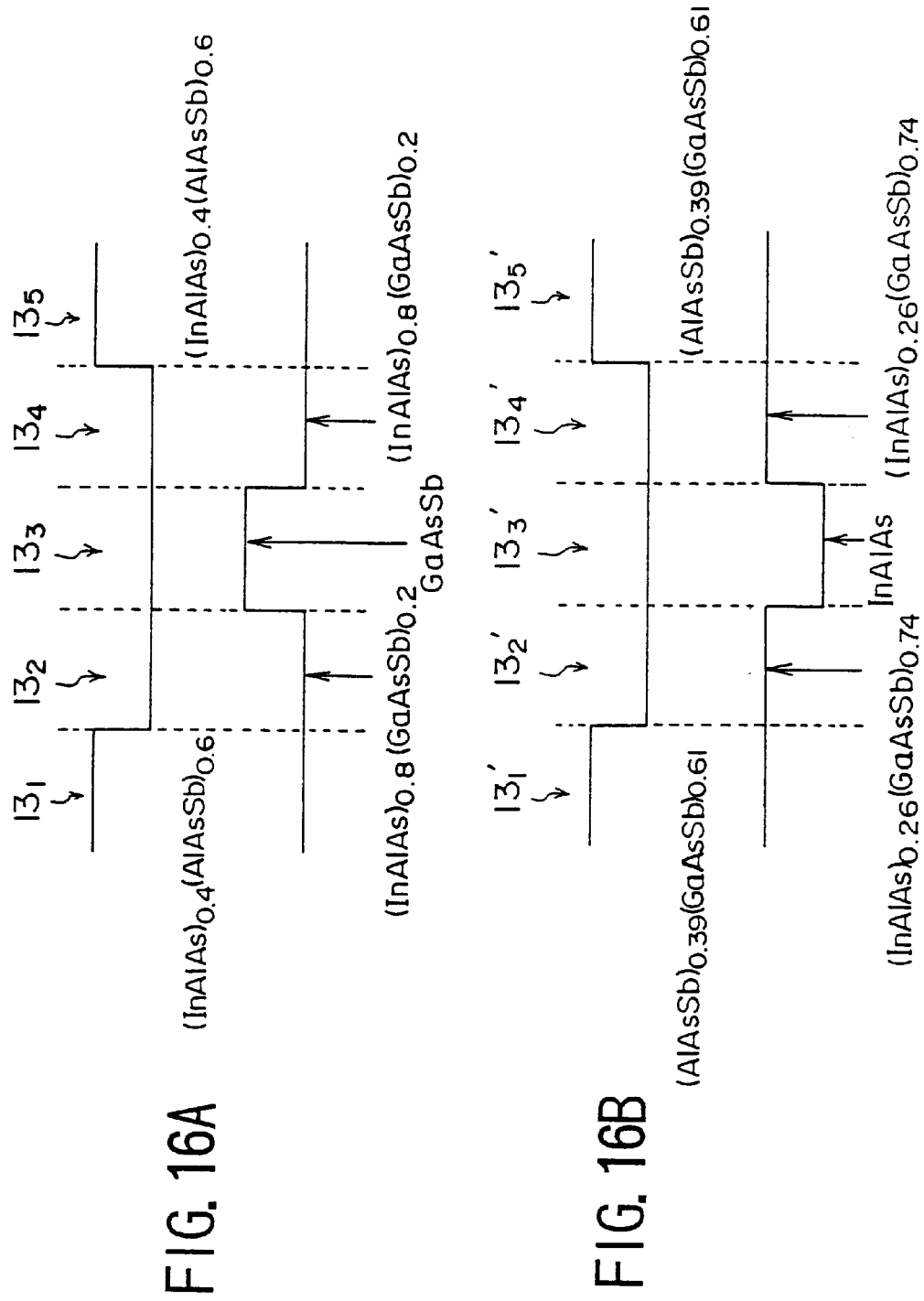
FIGS. 16A and 16B are band diagrams showing a part of the band structure of FIGS. 15A–15D in detail.

FIGS. 16A and 16B show the examples of realizing the band structure of FIGS. 15C and 15D respectively.

Referring to FIG. 16A, the quantum dot 13D now includes a consecutive stacking of five mini-quantum dots $13_1$–$13_5$ in place of the stacking of the three mini-quantum dots 13a–13c, wherein the mini-quantum dots $13_1$ and $13_5$ have a composition of $(InAlAs)_{0.4}(AlAsSb)_{0.2}$ while the mini-quantum dots $13_2$ and $13_4$ have a composition of $(InAlAs)_{0.2}(GaAsSb)_{0.2}$. Further, the quantum dot $13_3$ has a composition GaAsSb.

In the example of FIG. 16B, on the other hand, the quantum dot 13D includes a consecutive stacking of five mini-quantum dots $13_1'$–$13_5'$ wherein the mini-quantum dots $13_1'$ and $13_5'$ have a composition of $(AlAsSb)_{0.39}(GaAsSb)_{0.61}$ while the mini-quantum dots $13_2'$ and $13_4'$ have a composition of $(InAlAs)_{0.26}(GaAsSb)_{0.74}$. Further, the quantum dot $13_3'$ has a composition InAlAs.

Figure 17:
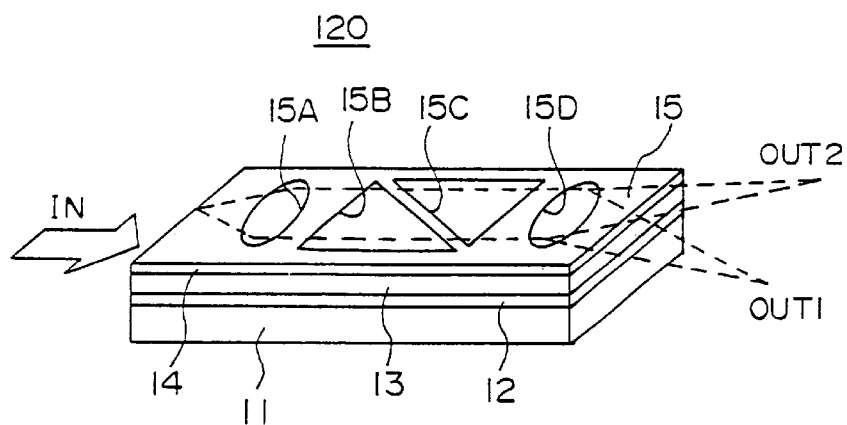
FIG. 17 is an oblique view showing the overall construction of the non-linear optical device of the twelfth embodiment.

FIG. 17 shows the construction of a non-linear optical device 120 that uses such a third-order non-linear optical effect, wherein those parts corresponding to the parts described previously are designated by the same reference numerals and the description thereof will be omitted. In the third-order non-linear optical effect, it should be noted that the refractive index of the active layer is changed in response to an optical radiation applied to the active layer.

Referring to FIG. 17, the non-linear optical effect 120 has a construction similar to the construction of the non-linear optical device 10 explained with reference to FIG. 2 except that an opaque film 15 is provided on the upper cladding layer 14 in place of the electrodes 14A–14D. Further, the opaque film 15 is formed with optical windows 15A–15D respectively in correspondence to the electrodes 14A–14D. In the active layer 13, quantum dots having any of the band structures of FIGS. 15A–15D are formed.

In such a construction, it is possible to induce a refractive index in the active layer 13 in correspondence to the optical windows 15A–15D, by irradiating a control optical beam to such optical windows 15A–15D. As a result of such an irradiation of the control optical beam, the optical path of the outgoing optical beam is switched between the optical out-path $OUT_1$ and the optical out-path $OUT_2$.

It should be noted that a similar switching of the optical path is possible also in the optical devices of FIGS. 14A–14C by forming the quantum dots having a band structure of any of FIGS. 15A–15D in the active layer and by forming an optical window in place of the electrode.

THIRTEENTH EMBODIMENT

Figure 18:
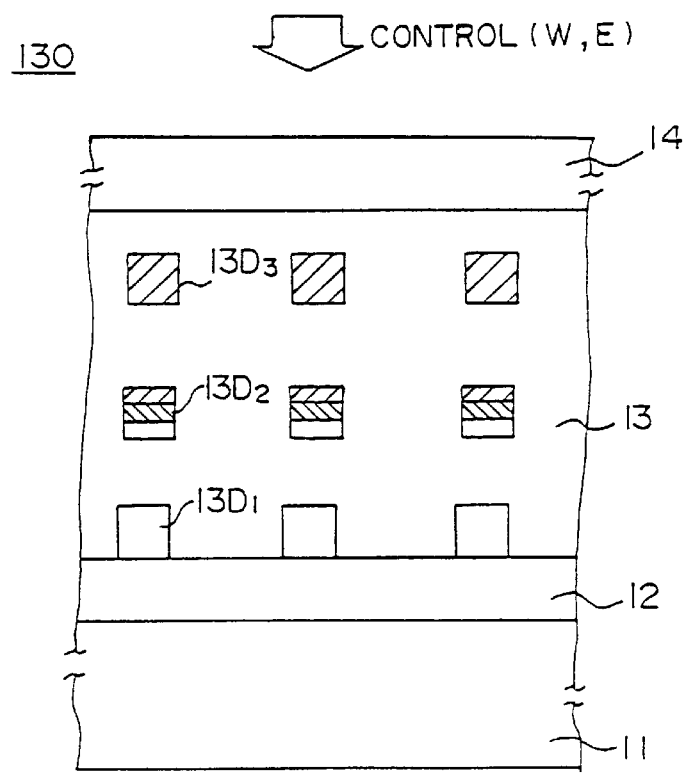
FIG. 18 is a cross-sectional diagram showing a part of a non-linear optical device according to a thirteenth embodiment of the present invention.

FIG. 18 shows the construction of a non-linear optical device 130 according to a thirteenth embodiment of the present invention, wherein those parts corresponding to the parts described previously are designated by the same reference numerals and the description thereof will be omitted.

Referring to FIG. 18, the non-linear optical device 130 has a construction similar to that of the non-linear optical device 120 of FIG. 17 in that the non-linear optical device 130 has an optical window and controlled by a control optical beam.

Figure 19:
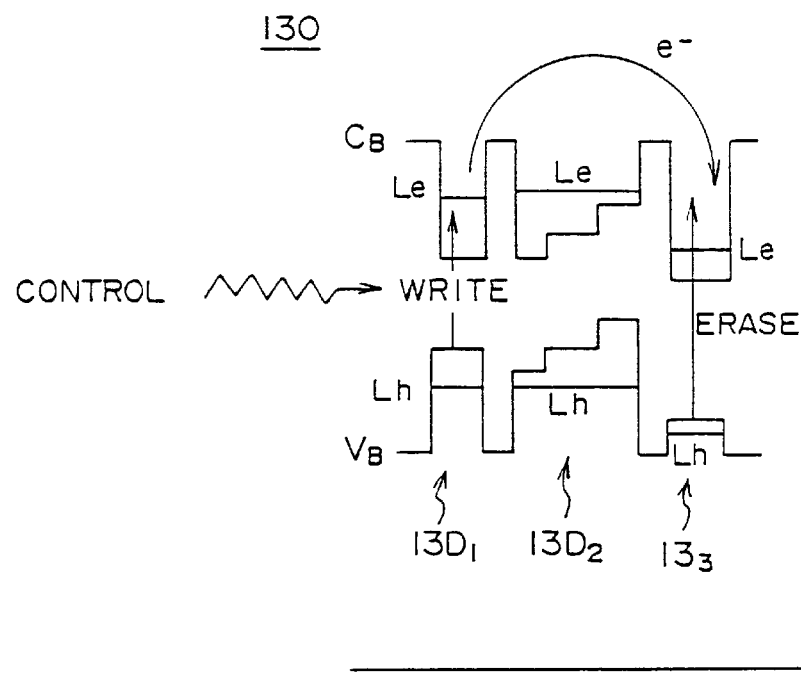
FIG. 19 is a band-diagram showing the principle of optical excitation of the quantum dot in the construction of FIG. 18.

On the other hand, the non-linear optical device 130 is distinct over the non-linear optical device 120 in that the quantum dots formed in the active layer 13 lack a symmetry in the z-direction as indicated in the band diagram of FIG. 19.

In operation, there occurs an optical excitation of electrons in the quantum dot $13D_1$ in response to the injection of the control optical beam into the active layer 13 through the upper cladding layer, wherein the control optical beam is produced to have a wavelength W set such that the excitation of the electron occurs in the quantum dot $13D_1$ from a quantum level $L_h$ to a quantum level $L_e$.

In the construction of FIG. 18, it should be noted that the quantum dot $13D_3$ is formed to have a quantum level $L_e$ for the electrons such that the quantum level $L_e$ of the electrons is located at an energetically lower level with respect to the quantum level $L_e$ of the quantum dot $13D_1$. Thus, the electrons excited in the quantum dot $13D_1$ fall into the quantum level $L_e$ of the quantum dot $13D_3$, and there develops an electric field between the quantum dot $13D_1$ in which holes are accumulated as a result of the optical excitation of the electrons and the quantum dot $13D_3$ in which the electrons are accumulated. In other words, there develops a polarization in the active layer 13 as a result of such an optical excitation of the electrons, and the intermediate mini-quantum dot $13D_2$ experiences an electric field associated with such a polarization.

As the intermediate quantum dot $13D_2$ has an asymmetric band structure as indicated in FIG. 5B, the active layer 13 of the non-linear optical device 130 shows a second-order non-linear optical effect, which is induced by an optical radiation.

FOURTEENTH EMBODIMENT

Figure 21:
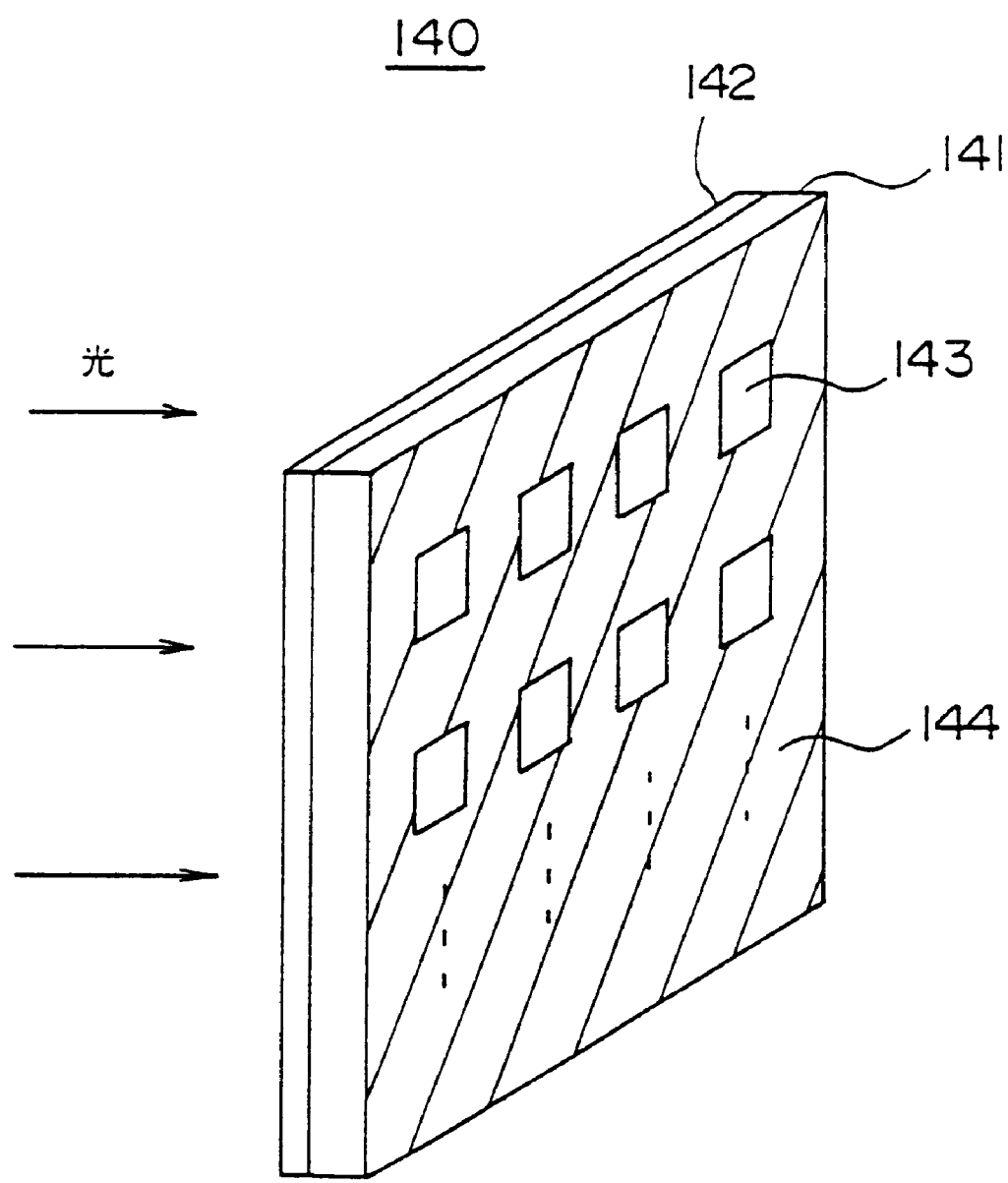
FIG. 21 is an oblique view showing the overall construction of an optical spatial modulator according to a fourteenth embodiment of the present invention.

FIG. 21 shows the construction of an optical spatial modulator 140 according to a fourteenth embodiment of the present invention.

Referring to FIG. 21, the optical spatial modulator 140 includes a semiconductor layered body 141 similar to the layered body of the semiconductor layers 11–14 forming the non-linear optical device 10 of FIG. 2, wherein the layered body 141 carries, on a rear surface thereof corresponding to the rear surface of the substrate 11, a transparent electrode 142 covering the foregoing rear surface uniformly. Further, the layered body 141 carries, on a front surface thereof, a plurality of transparent electrode elements 143 arranged in a row and column formation. Further, the front surface of the layered body is covered, except for those parts provided with the transparent electrode elements 143, with an opaque film 144.

Each of the transparent electrode elements 143 is driven by a voltage signal supplied thereto via a drive line not shown on the layered body 141, wherein the foregoing voltage signal induces a change of refractive index in the active layer included in the layered body 141. The active layer includes therein the quantum dots. As a result of such a refractive index change, the back light supplied to the rear surface of the layered body 141 of the optical spatial modulator 140 from an external optical source (not shown) is turned on and off.

Figure 20:
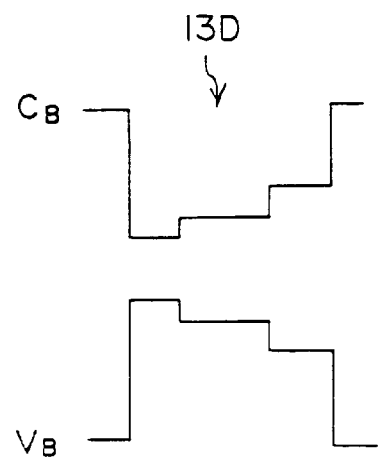
FIG. 20 is a band diagram showing another example of the band structure.

It should be noted that the band structure of the quantum dot 13D is by no means limited to the one shown in FIGS. 4A–4C, but other band structure such as the one shown in FIG. 20 may also be employed.

Further, the formation of the quantum dots is by no means limited to those that use the S-K mode island growth but the quantum dots may be formed by other suitable processes such as the one described in the U.S. Pat. No. 5,175,739. In the foregoing process, the quantum dots are formed on a stepped, offset surface of a substrate by a lateral epitaxial growth.

Further, the present invention is by no means limited to the embodiments described heretofore, but various variations and modifications may be made without departing from the scope of the invention.

What is claimed is:

1. A non-linear optical semiconductor device, comprising:
   a semiconductor substrate;
   a semiconductor layer of a first semiconductor material formed on said semiconductor substrate, said semiconductor layer passing an optical beam therethrough;
   plurality of quantum dots of a second semiconductor material having a bandgap smaller than a bandgap of said first semiconductor material, said plurality of quantum dots being formed in said semiconductor layer with a mutual spatial separation; and
   an electrode provided on said semiconductor layer,
   each of said plurality of quantum dots having a composition that changes therewithin in a direction perpendicular to a principal surface of said semiconductor surface from a first side thereof to a second side thereof, such that an electron has a larger probability at said first side of said quantum dot and a smaller probability at said second side of said quantum dot when said electron is in a first quantum level formed on a valence band, and such that an electron has a smaller probability at said first side of said quantum dot and a larger probability at said second side of said quantum dot when said electron is in a second, different quantum level formed on a conduction band, said first side and said second side being in a mutually opposing relationship in a direction perpendicular to said substrate.

2. The non-linear optical semiconductor device as claimed in claim 1, wherein each of said plurality of quantum dots changes said composition such that said quantum dot has a larger conduction band discontinuity with respect to a conduction band of said first semiconductor material constituting said semiconductor layer at said first side of said quantum dot and a smaller conduction band discontinuity with respect to said conduction band at said second side of said quantum dot, and such that said quantum dot has a smaller valence band discontinuity with respect to a valence band of said first semiconductor material at said first side of said quantum dot and a larger valence band discontinuity with respect to said valence band at said second side of said quantum dot.

3. A non-linear optical semiconductor device, comprising:
   a semiconductor substrate;
   a semiconductor layer of a first semiconductor material formed on said semiconductor substrate, said semiconductor layer passing an optical beam therethrough;
   a plurality of quantum dots of a second semiconductor material having a bandgap smaller than a bandgap of said first semiconductor material, said plurality of quantum dots being formed in said semiconductor layer with a mutual spatial separation; and
   an electrode provided on said semiconductor layer,
   each of said plurality of quantum dots having a uniform composition,
   said plurality of quantum dots collectively changing in composition in a direction perpendicular to a principal surface of said semiconductor substrate, such that an electron has a larger probability at said first side of said quantum dot and a smaller probability at said second side of said quantum dot when said electron is in a first quantum level formed on a valence band, and such that an electron has a smaller probability at said first side of said quantum dot and a larger probability at said second side of said quantum dot when said electron is in a second, different quantum level formed on a conduction band, said first side and said second side being in a mutually opposing relationship in a direction perpendicular to said substrate.

4. The non-linear optical semiconductor device as claimed in claim 3, wherein said collective change of composition of said quantum dots occurs asymmetrically in said direction perpendicular to said semiconductor substrate.

5. The non-linear optical semiconductor device as claimed in claim 3, wherein said collective change of composition of said quantum dots occurs stepwise in correspondence to each of said quantum dots.

6. A non-linear optical semiconductor device, comprising:
   a semiconductor substrate;

a semiconductor layer of a first semiconductor material formed on said semiconductor substrate, said semiconductor layer adapted to pass an optical beam therethrough;

a plurality of quantum dots of second semiconductor material having a bandgap smaller than a bandgap of said first semiconductor material, said plurality of quantum dots being formed in said semiconductor layer with a mutual spatial separation; and an electrode provided on said semiconductor layer, wherein each of said plurality of quantum dots being sandwiched, in said semiconductor layer, by first and second barrier layers in a direction perpendicular to said semiconductor substrate, and wherein said first and second barrier layers having respective dopings different from each other.

7. The non-linear optical semiconductor device as claimed in claim 6, wherein said first and second barrier layers are doped with respective dopants of mutually different conductivity types.

8. The non-linear optical semiconductor device as claimed in claim 6, wherein said first and second barrier layers have respective, mutually different compositions.

9. The non-linear optical semiconductor device as claimed in claim 8, wherein said quantum dots are repeated a plurality of times in said semiconductor layer in said direction perpendicular to said semiconductor substrate, and wherein said first and second barrier layers sandwiching a quantum dot changes a doping thereof from a first quantum dot to a second quantum dot located above said first quantum dot in said semiconductor layer.

10. The non-linear optical semiconductor device as claimed in claim 6, wherein each of said quantum dots forms a strained heteroepitaxial system to said semiconductor substrate.

11. A non-linear optical semiconductor device, comprising:

a semiconductor substrate;

a semiconductor layer of a first semiconductor material formed on said semiconductor substrate, said semiconductor layer passing an optical beam therethrough;

a plurality of quantum dots of a second semiconductor material having a bandgap smaller than a bandgap of said first semiconductor material, said plurality of quantum dots being formed in said semiconductor layer with a mutual spatial separation; and an electrode provided on said semiconductor layer, each of said plurality of quantum dots having a uniform composition that changes therein in a direction perpendicular to a principal surface of said semiconductor substrate from a first side of said quantum dot to an opposite side of said quantum dot, such that an electron has a larger probability at said first side of said quantum dot and a smaller probability at said second side of said quantum dot when said electron is in a first quantum level formed on a valence band, and such that an electron has a smaller probability at said first side of said quantum dot and a larger probability at said second side of said quantum dot when said electron is in a second, different quantum level formed on a conduction band, said first side and said second side being in a mutually opposing relationship in a direction perpendicular to said substrate, wherein each of said plurality of quantum dots is formed of a plurality of quantum dot elements aligned generally perpendicularly to said substrate to form a quantum mechanical coupling with each other, said plurality of aligned quantum dot elements thereby forming an effectively single quantum dot, and said plurality of aligned quantum dot elements having respective compositions that change perpendicularly to said semiconductor substrate, said plurality of quantum dot elements respectively changing said compositions thereof such that a quantum dot element located at said first side of said quantum dot has a larger conduction band discontinuity with respect to a conduction band of said first semiconductor material constituting said semiconductor layer and a quantum dot element located at said second side of said quantum dot has a smaller conduction band discontinuity with respect to said conduction band at a second, opposite side of said quantum dot, and such that said quantum dot element located at said first side has a smaller valence band discontinuity with respect to a valence band of said first semiconductor material and said quantum dot element located at said second side has a larger valence band discontinuity with respect to said valence band.

12. The non-linear optical semiconductor device as claimed in claim 11, wherein said effectively single quantum dot has a composition that changes stepwise perpendicularly to said semiconductor substrate in correspondence to each of said aligned quantum dot elements.

13. The non-linear optical semiconductor device as claimed in claim 11, wherein each of said aligned quantum dot elements forming said effectively single quantum dot forms a strained heteroepitaxial system with respect to said semiconductor substrate.

14. A non-linear optical semiconductor device comprising:

a semiconductor substrate;

a semiconductor layer of a first semiconductor material formed on said semiconductor substrate, said semiconductor layer adapted to pass an optical beam therethrough;

a plurality of quantum dots of a second semiconductor material having a bandgap smaller than a bandgap of said first semiconductor material, said plurality of quantum dots being formed in said semiconductor layer with a mutual spatial separation; and an electrode provided on said semiconductor layer, wherein each of said plurality of quantum dots having a composition that changes therein in a direction perpendicular to a principal surface of said semiconductor substrate from a first side of said quantum dot to an opposite side of said quantum dot, wherein each of said plurality of quantum dots is formed of:

a plurality of quantum dot elements aligned generally perpendicularly to said substrate to form a quantum mechanical coupling with each other, said aligned quantum dot elements thereby forming an effectively single quantum dot; and a plurality of barrier layers intervening between said plurality of aligned quantum dot elements, wherein said plurality of barrier layers have a composition that changes from one barrier layer to another barrier layer in a direction perpendicular to said semiconductor substrate.

* * * * *